United States Patent
Knaipp et al.

(10) Patent No.: US 7,820,342 B2
(45) Date of Patent: Oct. 26, 2010

(54) MULTIPLE MASK AND METHOD FOR PRODUCING DIFFERENTLY DOPED REGIONS

(75) Inventors: Martin Knaipp, Unterpremstätten (AT); Rainer Minixhofer, Unterpremstätten (AT); Martin Schrems, Eggersdorf (AT)

(73) Assignee: Austriamicrosystems AG, Unterpremstättan (AT)

(*) Notice: Subject to any disclaimer, the term of this patent is extended or adjusted under 35 U.S.C. 154(b) by 0 days.

(21) Appl. No.: 11/792,464

(22) PCT Filed: Nov. 3, 2005

(86) PCT No.: PCT/EP2005/011774

§ 371 (c)(1),
(2), (4) Date: Mar. 19, 2008

(87) PCT Pub. No.: WO2006/058594

PCT Pub. Date: Jun. 8, 2006

(65) Prior Publication Data

US 2009/0098718 A1    Apr. 16, 2009

(30) Foreign Application Priority Data

Dec. 3, 2004    (DE) .................. 10 2004 058 412

(51) Int. Cl.
*G03F 1/00* (2006.01)
(52) U.S. Cl. .......................................... 430/5
(58) Field of Classification Search ...... 430/5, 430/30, 394; 250/492.21; 257/E21.345; 438/525
See application file for complete search history.

(56) References Cited

U.S. PATENT DOCUMENTS

| | | | |
|---|---|---|---|
| 4,648,174 A | 3/1987 | Temple et al. | |
| 5,300,454 A | 4/1994 | Taft et al. | |
| 5,512,498 A | 4/1996 | Okamoto | |
| 6,400,003 B1 | 6/2002 | Huang | |
| 6,551,909 B1 | 4/2003 | Fujihira | |
| 6,593,175 B2* | 7/2003 | Feudel et al. | 438/152 |
| 6,724,042 B2 | 4/2004 | Onishi et al. | |
| 6,852,453 B2* | 2/2005 | Wu | 430/5 |
| 2002/0084496 A1 | 7/2002 | Chatani | |
| 2004/0164379 A1 | 8/2004 | Raisanen et al. | |
| 2006/0071183 A1* | 4/2006 | Shibata et al. | 250/492.23 |

FOREIGN PATENT DOCUMENTS

| | | |
|---|---|---|
| DE | 101 06 006 A1 | 8/2001 |
| DE | 103 37 808 B3 | 10/2004 |
| JP | 09-55438 | 2/1997 |
| JP | 11 204543 A | 10/1999 |
| JP | 2000-228496 | 8/2000 |
| WO | WO 95/29505 A | 11/1995 |

* cited by examiner

*Primary Examiner*—Stephen Rosasco
(74) *Attorney, Agent, or Firm*—Cohen Pontani Lieberman & Pavane LLP

(57) ABSTRACT

In order to produce doping regions (DG) in a substrate (S) having different dopings with the aid of a single mask (DM) different mask regions are provided which have elongated mask openings (MO) having different orientations relative to the spatial direction of an oblique implantation. The substrate is rotated between the first and second oblique implantations, wherein during the first oblique implantation maximum and minimum shadings in the different mask regions are opposite one another and the conditions are precisely reversed during the second oblique implantation after the rotation of the substrate.

9 Claims, 4 Drawing Sheets

MULTIPLE MASK AND METHOD FOR PRODUCING DIFFERENTLY DOPED REGIONS

RELATED APPLICATIONS

This is a U.S. national stage of application No. PCT/EP2005/011774, filed on Nov. 3, 2005.

This patent application claims the priority of German patent application no. 10 2004 058 412.5 filed Dec. 3, 2004, the disclosure content of which is hereby incorporated by reference.

FIELD OF THE INVENTION

The present invention is related to a mask and method for producing different dopings in a substrate.

BACKGROUND OF THE INVENTION

In order to produce dopings in semiconductor materials, in particular, implantation methods are suitable in which the implantation depth is determined for example by the kinetic energy of the, for example ionic, dopants to be implanted. As an alternative and, if appropriate, in addition, it is possible to cause an implanted dopant to diffuse further into the semiconductor material by setting suitable drive-in conditions, in particular by running a suitable temperature program. By precisely coordinating implantation methods and drive-in conditions, different doping profiles can be produced in this way. A further known possibility for supervising the implantation depth consists in supervising the quantity of implanted dopant.

In the case of electronic components suitable for a high-voltage use at 50 V, for example, setting optimum doping profiles is particularly important since electrical short circuits e.g. toward the substrate or toward other component structures can occur particularly easily under the influence of the high voltage present at the component. Moreover, such an unsuitable doping profile can likewise cause undesirable currents, e.g. on account of impact ionization.

For electrical insulation of transistor contacts, in particular in the case of high-voltage components, use is usually made of wells having opposite conductivities that are arranged one in another, so that at the junctions between the connection region doped with a dopant of a first connectivity type and the outer insulating well, which is doped with a dopant of a second conductivity type, and also at the junction between the insulating well and the substrate, which is in turn doped with a dopant of the first conductivity type, additional space charge zones arise, which constitute charge carrier barriers.

In order to produce different deep dopings alongside one another in a substrate, a plurality of doping steps with different doping masks have been used heretofore in order to be able to use either a different implantation dose or a thermal budget for driving in the implanted dopant that is different for the doping steps. With regard to the additional doping masks required and the additional method steps associated therewith, this requires an increased outlay compared with producing a doping region with a uniform doping depth.

In order to produce dopings of different types alongside one another in a substrate, use has also usually been made of a plurality of doping steps with different doping masks heretofore.

U.S. Pat. No. 5,300,454 A discloses a method which can produce different levels of doping of the same type in different regions in a single step. For this purpose, a mask is produced which has regions having different geometrical features. The different regions in the mask differ by virtue of different density of mask openings. The doping intensity that can thereby be obtained is a function of the density of the mask openings.

U.S. Pat. No. 5,512,498 A discloses a method by which two different dopings can be produced in two different regions in two main steps, but with the same mask. Firstly, an oblique implantation is carried out at a first angle to a rotating substrate. This is followed by an essentially vertical implantation. In the first region, the mask openings have such a small aspect ratio that the dopants do not reach the substrate during the oblique implantation. During the second main doping step, no distinction is made between first and second region. However, this method does not enable two opposite dopings to be produced with the same mask.

SUMMARY OF THE INVENTION

It is one object of the present invention to provide a mask and a doping method for the mask by means of which two different dopants of any type can be produced.

The invention is based on the idea of creating for implantations a mask which bears on a substrate and which has at least a first and a second mask region, wherein the first and second mask regions differ by virtue of the fact that they have a different shading behavior compared with implantation steps that are carried out from different spatial directions.

Different shading behavior is achieved by means of elongated mask openings, wherein first mask openings within the first mask region are oriented parallel to a first orientation and second mask openings within the second mask region are oriented parallel to a second orientation, wherein the first and second orientations form an angle $\beta<90°$ relative to one another, said angle $\beta$ being different than zero. In this way, it is possible to carry out, during a first oblique implantation from a spatial direction parallel to the first orientation, in the first mask region, a minimum shading with respect to the implantation and, in the second mask region, a higher shading by comparison therewith. Afterward, the substrate can be rotated by the angle $\beta$ and a second oblique implantation can be carried out from the same spatial direction parallel to the mask openings of the second mask region, in which case a minimum shading is then obtained in the second mask region, whereas a higher shading is obtained in the first mask region. As an alternative to the rotation of the substrate, it is also possible, of course, to carry out the second oblique implantation from a spatial direction that differs by the angle $\beta$.

The shading that can be obtained with the mask is dependent on the aspect ratio of the mask openings in the mask layer and also on the angle $\alpha$ of incidence of the dopant ions and atoms introduced into the substrate during the implantation, said angle being measured relative to a normal that is perpendicular to the substrate. In this case, it is possible, in the case of an oblique implantation from a spatial direction transverse with respect to the orientation of the mask openings, to choose the aspect ratio in a manner dependent on the implantation angle such that the obliquely implanted dopant does not reach the substrate within the mask opening and is completely shaded by the mask. If this also applies to the other mask region during the second implantation, then it is possible to produce two different, if appropriate opposite, dopings with the same mask. In other words, a complete shading is produced per implantation step in a respective mask region, with the result that the two implantation steps in each case selectively lead to a doping of the substrate below the respective mask region and do not mutually disturb one another in the process.

Ions that act as donors or acceptors in the semiconductor are implanted during the implantation. Within the scope of the invention, however, dopants are also understood to mean all other ions which can be implanted in order to thereby obtain specific effects in the semiconductor.

It is advantageous to provide mask openings having the same width b in each case in the first and second mask regions. In this case, a mask region may have a plurality of mask openings of identical type that are arranged at the same distance parallel to one another. The width b of the mask openings and the distance a between them are chosen such that below the mask openings implanted regions arise which can grow together after a heat treatment step to form a uniform doped region having a desired dopant concentration. This means that a smaller distance a is chosen for the mask openings for shallower doped regions, whereas a larger distance can be chosen for deeper doped regions.

In order to obtain the maximum homogeneity in the doped region after the drive-in of the implanted doping, however, it is advantageous to choose the distance a between the mask openings to be minimal in order to avoid concentration fluctuations of the diffused dopant.

In one development of the invention, provision is made of a third mask region comprising third mask openings, which are formed in elongated fashion and parallel to one another along a third orientation. In this case, the orientation of the third mask region is chosen such that it forms if appropriate different angles β relative to the orientations of the other two mask regions. It is advantageous, given identical a and b, to choose the angles β to be maximal, so that in the case of two mask regions an angle β=90°, whereas in the case of three mask regions an angle β of in each case 60° between two orientations is complied with.

For a given implantation angle α and a given width b of the mask openings, this corresponds to a maximum shading in the second and third mask regions if oblique implantation is effected parallel to the first orientation.

The mask itself bears on the substrate and constitutes a patterned resist layer, by way of example. It is also possible, however, to use a hard mask for the implantation method, which hard mask can likewise be patterned by means of a phototechnology, that is to say with a resist structure. By way of example, oxide masks or those composed of silicon nitride are suitable as the hard mask. Depending on the material of the mask layer, it is also possible to take account of a further parameter, which takes account of the penetration depth of the dopant during the implantation into the surface of the mask structure, and in particular into the sidewalls of the mask openings. As the penetration depth of the dopant into the mask increases, the aspect ratio should be chosen to be correspondingly higher or alternatively the implantation angle α should be increased.

An optimum implantation angle is e.g. in the region of 45°, but is additionally dependent on the thickness of the mask layer, the implantation energy and the resolution accuracy of the lithography used for mask production and may therefore deviate from that. For different dopants, different implantation angles, too, may be optimal. Given an implantation angle of 45°, for example, a complete shading is obtained with a mask opening whose aspect ratio measured in the implantation direction is chosen to be greater than or equal to 1, that is to say in which the height h of the mask layer is greater than or equal to the width b of the mask opening. It is advantageous to comply with a tolerance with respect to scattering at edges of the mask openings and to take account of the fact that the mask thickness particularly in the lower region of the mask openings is no longer sufficient to completely shade the dopants during the oblique implantation and thus to prevent them completely from penetrating into the substrate.

In the cross section parallel to the substrate surface, the mask openings are preferably embodied in the form of elongated rectangles. However, it is also possible for the mask openings to be embodied with a different form and in particular as elongated parallelograms, trapezoids or with rounded ends. A parallelogram is advantageous particularly when the mask regions are rectangles oriented parallel to one another and the angle β between the orientations of the mask openings within two mask regions deviates from 90° (see FIG. 4). Such mask regions can be completely filled with mask openings only when the mask openings are formed as parallelograms in the cross section parallel to the substrate.

The mask according to the invention furthermore makes it possible to produce not only different dopings in different mask regions, but also different doping intensities in different mask regions. This becomes possible by increasing or decreasing the "density" of the mask openings in a mask region. This is done by correspondingly altering the distance between the mask openings or by varying the width b of the mask openings, in each case relative to the other mask region. Of course, the doping intensity can also be set directly by way of the duration of the implantation and thus the quantity of the dopants implanted.

Disregarding the fact that a given mask material is transmissive to a certain degree or to a certain depth with respect to the implantation, in a mask opening a direct impingement of dopant on the substrate surface uncovered at the bottom of the mask openings is avoided if, in the case of a mask opening orientation rotated by the angle β relative to the implantation direction projected into the plane, the height h times the tangent of the implantation angle $\alpha \geq$ the width b divided by the cosine of β' (where angle β' is the complement of angle β). What is thereby achieved is that in the first mask region, in the case of a first implantation at an implantation angle $\alpha \geq \alpha_{min}$ ($\alpha_{min}$=smallest angle α with complete shading), the mask results in a minimum shading and, in the second mask region, which is rotated by the angle β with regard to its orientation relative to the first mask region, a complete shading against dopants impinging directly on the substrate.

The invention is explained in more detail below on the basis of exemplary embodiments and the associated figures. The figures serve solely for illustrating the invention and are therefore set out only schematically and not in a manner true to scale. Identical or identically acting parts are designated by the same reference symbols

DETAILED DESCRIPTION OF THE DRAWINGS

Figure 1A:
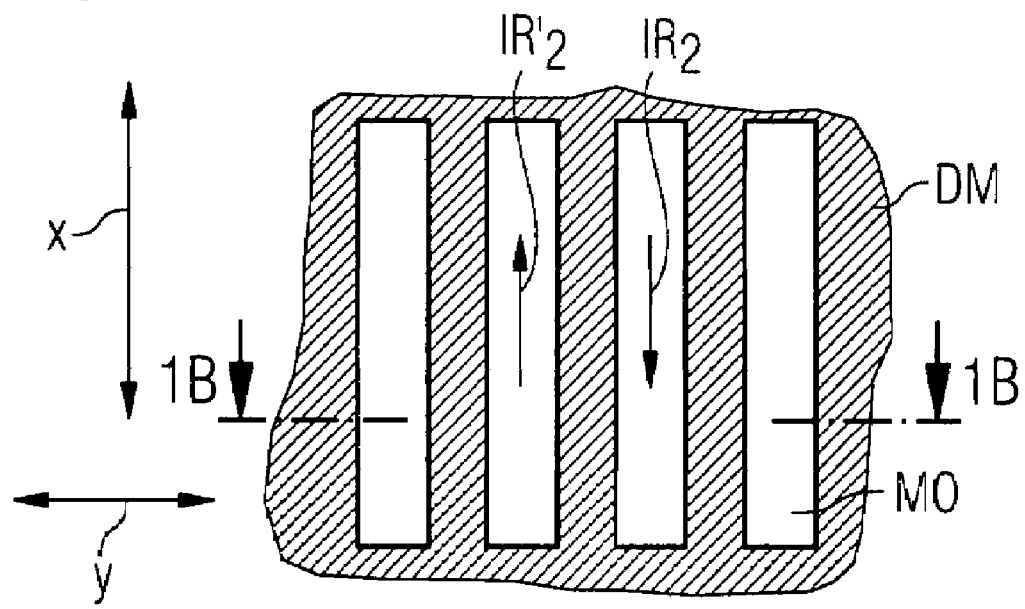
FIG. 1A shows a first mask region comprising elongated mask openings.
Figure 1B:
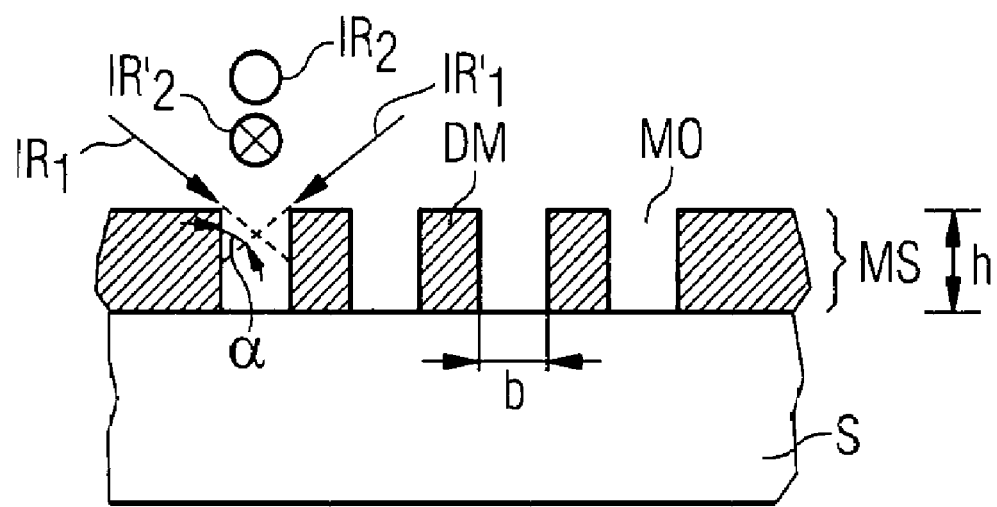
FIG. 1B shows a cross section taken along line 1B-1B in FIG. 1A.

FIGS. 1A and 1B show a doping mask DM comprising elongated mask openings MO on the basis of a schematic plan view (FIG. 1A) and a cross section along the sectional plane 1b (FIG. 1B). The doping mask DM is patterned from a mask layer comprising any desired material that can be patterned and has little or no transmissivity in particular for the implantation. Suitable materials for producing masks for implantation purposes are, for example, resist layers or else hard masks composed of silicon nitride, for example. The height h of the mask layer or of the mask DM patterned therefrom is determined both depending on the width b of the mask opening and depending on the transmissivity of the mask material with respect to the implanted dopants. Elongated mask openings MO which are oriented parallel to the axis x have a minimum shading compared with an oblique implantation from the implantation direction IR2, which is represented by the arrows projected into the plane in the figure. In contrast, the mask DM illustrated has a maximum shading compared with an oblique implantation carried out parallel to the axis y along the implantation direction IR1. FIG. 1b illustrates the implantation along the implantation direction IR1 at an angle $\alpha$ of incidence, measured relative to the normal perpendicular to the surface of the substrate S, which leads to a complete shading of the substrate S with respect to the implantation through the mask DM. The implantation angle $\alpha$ is dimensioned such that the dopants accelerated along the implantation direction in the direction of the substrate can impinge exclusively on the sidewalls of the mask DM within the mask openings MO.

Figure 2A:
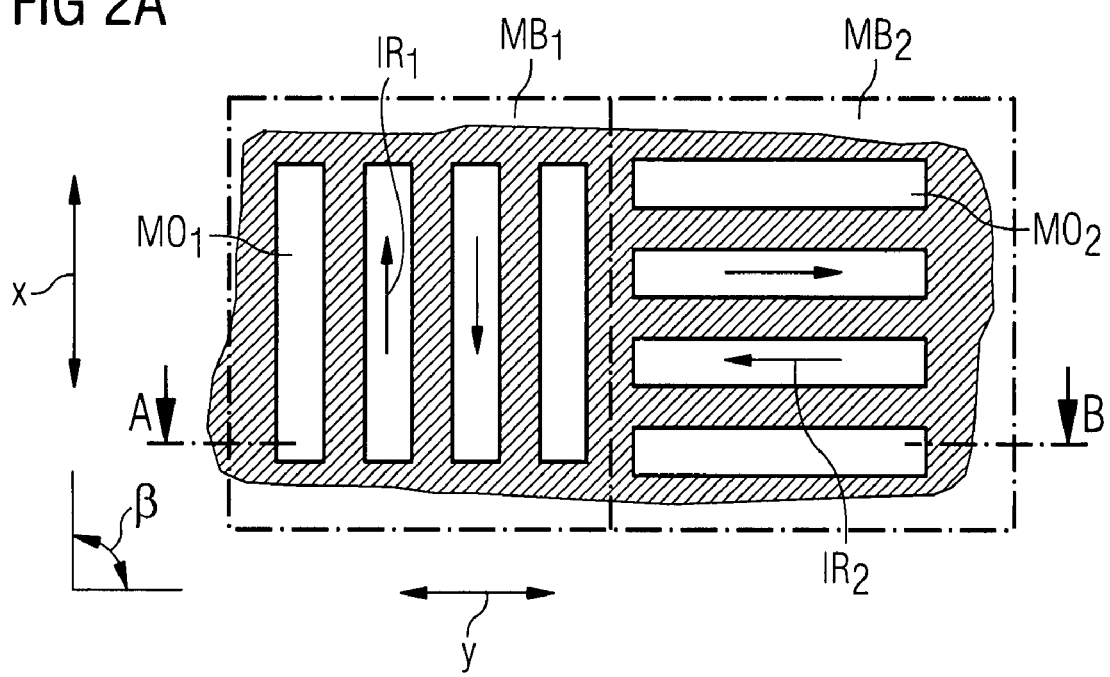
FIG. 2A shows two mask regions having different orientations.
Figure 2B:
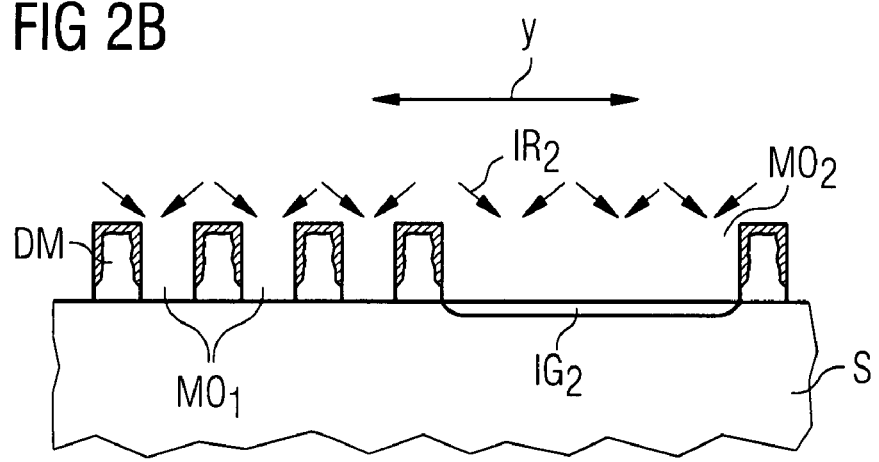
FIG. 2B shows a cross section taken along line A-B in FIG. 2A.

FIGS. 2A and 2B illustrate a mask according to an embodiment of the invention that makes use of this shading behavior of elongated mask openings. The mask comprises a first mask region MB1 comprising first mask openings MO1 and a second mask region MB2 comprising second mask openings MO2, which are elongated and oriented parallel to the axes x and y, respectively. The axes x and y form an angle $\beta$, preferably an angle of 90°, relative to one another. The illustrated mask DM comprising the two mask regions MB1, MB2 can then be used according to the invention to carry out a first implantation from an implantation direction IR1, during which the mask openings MO1 of the first mask region MB1 have a minimum shading, while a maximum shading is obtained in the mask openings MO2 of the second mask region MB2 with respect to said implantation along the implantation direction IR1. If the implantation angle a is chosen correspondingly, it is possible to achieve a complete shading in the second mask region MB2, with the result that during this implantation no dopant whatsoever passes into the substrate in the mask openings MO2, but it does indeed within the first mask openings MO1.

FIG. 2B shows the mask DM according to the invention on the basis of a schematic cross section along the line AB in FIG. 2A. The illustration shows the mask during or after an implantation along the implantation direction IR2, the projection of which into the substrate plane is oriented parallel to the axis y. It can clearly be discerned from FIG. 2B that such an implantation within the mask openings MO2 leads to a doping within the substrate in the region of the mask opening MO2. A second implanted region IG2 is produced in the process. In the first mask region MB1 comprising the first mask openings MO1, in contrast, the implantation is completely shaded by the doping mask DM. In this case, the dopants impinge exclusively on the mask DM and, if appropriate, penetrate a small depth into the surface of said mask, as is illustrated by the corresponding hatching in FIG. 2b. This makes it possible to produce a first doping with a first implantation parallel to the axis x within the first mask region, and to produce a doping (see implanted region IG2) with an implantation transversely with respect thereto along the axis y in a second mask region, wherein the substrate remains free of dopants from the first implantation in the second mask region MB2, whereas it remains free of dopants of the second implantation in the first mask region.

The same mask according to the invention can therefore serve for both implantations and need not be removed in between. Compared with known masks and known implantation methods using doping masks, by means of the mask according to the invention and the associated oblique implantation method the second mask is completely obviated without signifying any disadvantages for the production of the doping within the substrate S. Differently doped regions can be produced in this way, wherein arbitrary dopings can be produced independently of one another alongside one another with the same mask in different mask regions. Highly suitable combinations are e.g. an n-type and a p-type doping, but oxygen or nitrogen ions or other ions can also be implanted. It is also possible to produce dopings of the same conductivity type but with different ions with the aid of the mask according to the invention. By way of example, in the two implantation steps, arsenic and phosphorus can be introduced in different mask regions and the substrate can be doped correspondingly in said regions. Boron, for example, could then be implanted into a third mask region.

Figure 3:
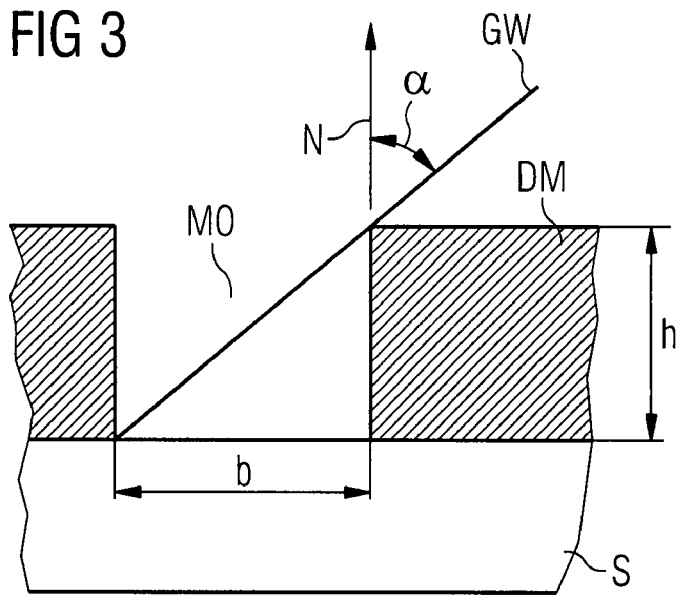
FIG. 3 shows a schematic cross section through a mask opening for elucidating the shading.

FIG. 3 sets out, on the basis of a schematic cross section transversely through a mask opening, how the mask opening is to be dimensioned in order that a hundred percent shading is effected during an oblique implantation at the implantation angle $\alpha$. If the implantation is carried out at a limit angle represented by the implantation direction GW, then a complete shading by the mask DM precisely just takes place, at least as far as the direct impingement of dopants on the surface of the substrate S within the mask opening MO is concerned. For the implantation direction at the limit angle GW, it holds true that the tangent of the corresponding associated implantation angle $\alpha$ is equal to the quotient b/h of the width and height of the mask opening MO. Complete shading does not occur for implantation angles that are less than $\alpha$, but it does indeed occur for implantations at an implantation angle $\alpha$>GW. This means that for a complete shading the dimensioning of h and b should be implemented such that the following holds true:

$$\tan \alpha \geq b/h.$$

Figure 4:
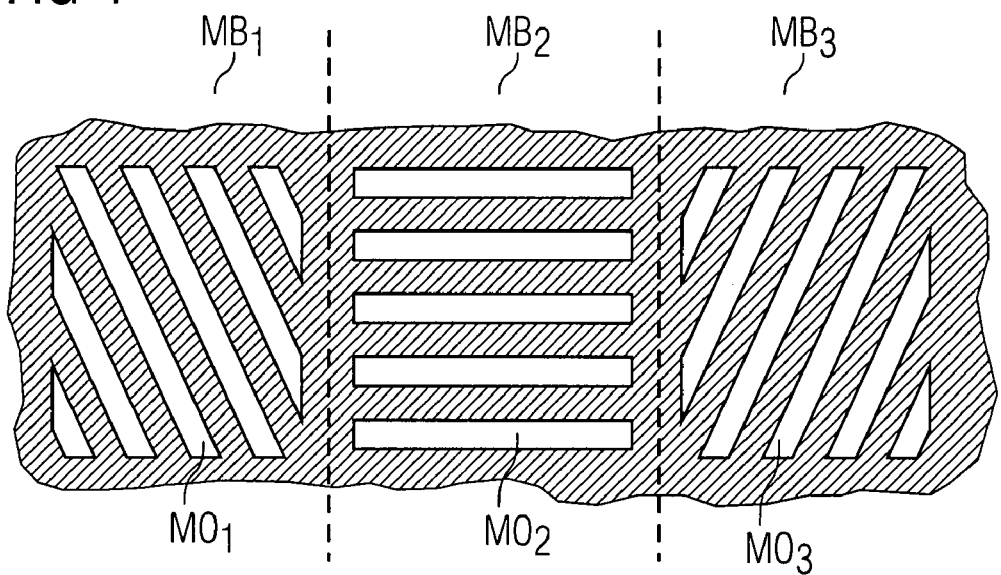
FIG. 4 shows a doping mask comprising three mask regions.
Figure 4:
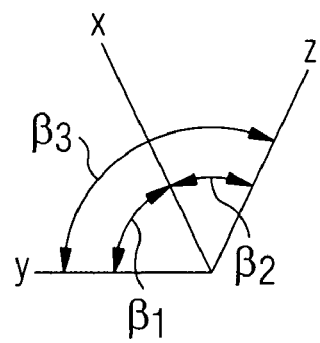

FIG. 4 illustrates a further mask DM according to an embodiment of the invention in schematic plan view, which mask comprises three mask regions MB1, MB2 and MB3 respectively having elongated mask openings $MO_1$, $MO_2$, $MO_3$ oriented along the axes x, y and z. The axis x forms an angle $\beta1$ with respect to the axis y and an angle $\beta2$ with respect to the axis z. The angle $\beta3$ denotes the angle between the axis y and the axis z. Such a mask also makes it possible to realize the principle according to the invention. Any oblique implantation which is conducted parallel to the orientation of the mask opening within a mask region leads to a minimum shading there and therefore to a maximum doping. In the remaining mask regions, in contrast, whose orientation is rotated by a corresponding angle $\beta$, a shading with respect to this implantation is obtained. Although $\beta1$ and $\beta2$ cannot both simultaneously assume a value of 90°, a shading which, through corresponding dimensionings of the dimensions of the mask openings MO, can be a hundred percent shading is also obtained with smaller angles β between the orientations of the mask openings of different mask regions.

In order to set certain dopant profiles, however, it may be desirable for the doping with a dopant not to be exclusively restricted to one mask region, but rather to lead to a lower doping intensity in a gradation of the doping intensity in the other mask regions as well. With the aid of an opposite doping along another implantation direction parallel to a second or third orientation, it is also possible to overcompensate for this lower doping.

Figure 5:
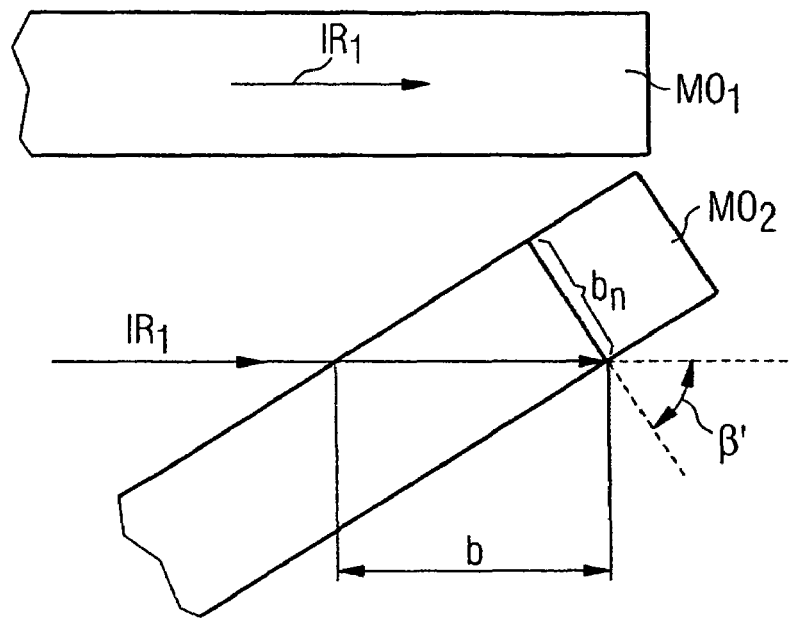
FIG. 5 shows the angles and size relationships of two mask openings having different orientations.

FIG. 5 shows two mask openings MO1, MO2 which are located opposite one another only in the figure, are associated with different mask regions usually spaced apart from one another and form an angle β relative to one another with regard to their orientation (with angle β' being the complement of angle β). If a first oblique implantation is conducted parallel to the implantation direction IR1 in accordance with the orientation of the first mask opening MO1, then said implantation impinges on the second mask opening MO2 of the second mask region at the angle β with respect to its orientation. In order to calculate the shading in the second mask opening MO2 under this implantation direction IR1, it is necessary to consider the corresponding profile of the mask opening parallel to said implantation direction. On the basis of a minimum width $b_n$ of the second mask opening M02, in this equivalent profile (profile along the oblique implantation) it is necessary to consider an obliquely projected width b, for which the following holds true:

$$b_n = b \cdot \cos \beta' \text{ or } b = b_n / \cos \beta'.$$

The following formula for calculating the limit angle for total shading results for oblique implantation directions:

$$h \cdot \tan \alpha \geq b_n / \cos \beta'.$$

In order, therefore, to obtain a shading, for a given implantation angle α, the height h must be chosen to be greater than emerges from this formula. As an alternative, the width b of the mask opening MO may also be chosen to be smaller in order to certainly obtain a complete shading for a given depression h.

Figure 6A:
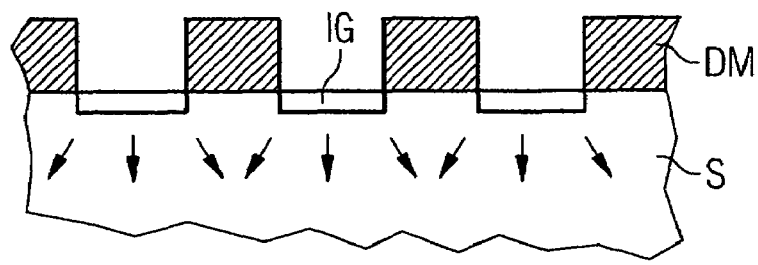
FIGS. 6A and 6B show the drive-in of an implanted doping on the basis of a schematic cross section.

As a result of the implantation, firstly implanted regions IG are produced in the corresponding mask regions or in the regions of the substrate which lie below the mask openings MO of a mask region. FIG. 6A shows them on the basis of a schematic cross section through the substrate. The implanted regions are relatively shallow and arranged spatially separately from one another below each mask opening of the corresponding mask region. It is necessary, therefore, to drive in the doping within the implanted regions IG deeper and to combine the regions that are spatially separated from one another with one another in the process.

The drive-in of the implanted dopants can be carried out after each individual implantation step. However, it is also possible to carry out the drive-in jointly for all of them in different mask regions with different dopings. The first case is preferred, however, since different drive-in conditions and in particular a different thermal budget are generally required for different dopants. It is thus possible to balance dopings that have different diffusion rates of the dopants by means of a corresponding distribution of the required thermal budget between the two drive-in steps.

Figure 6B:
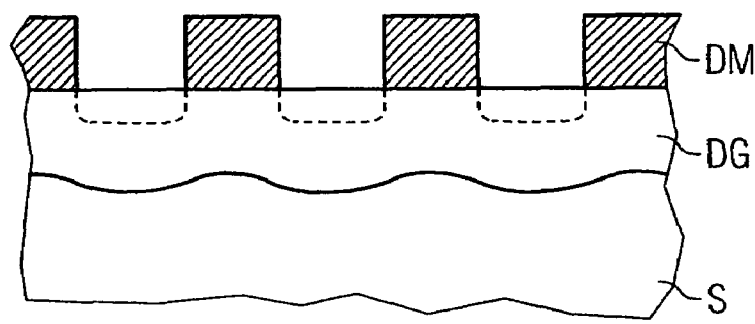

FIG. 6B shows how the originally separate implanted regions IG have combined according to the drive-in conditions to form a common homogeneous doped region DG having a homogeneous front on the underside in conjunction with a corresponding drive-in depth.

When setting the drive-in conditions, which also include a drive-in atmosphere, a pressure and a temperature program, the dopant concentration that was produced during the corresponding implantation step in the implanted regions IG should also be taken into account. In implanted regions having a higher dopant concentration, the dopants usually diffuse deeper into the substrate S, with the result that in mask regions having different dopant concentrations, in the implanted regions produced there, doped regions DG driven in to different depths are produced on account of this fact.

The method according to the invention can advantageously be used for producing insulating wells, so-called PTUBs, NTUBs, PWELLs and NWELLs, for high-voltage components. For this purpose of application, the incorporation conditions are preferably chosen such that the dopant is driven into the semiconductor (substrate S) to a depth of approximately 10 μm. In correspondingly differently doped regions, it is possible to realize different parts of semiconductor components, in particular e.g. transistors for bipolar high-voltage components in silicon or other semiconductor substrates.

Although the method has been illustrated only on the basis of a few exemplary embodiments, it is not, of course, restricted thereto. Variation possibilities arise in particular from the precise shaping of the mask openings, from the number, size and distribution thereof and also from the arrangement of different mask regions relative to one another. The mask regions can additionally be differentiated from one another in terms of size and form; mask openings having different lengths may also be arranged within a mask region. It is also possible to divide the mask openings according to length into a series of shorter mask openings, in which case the division in parallel rows may be different or offset.

Further deviations from the exemplary embodiments illustrated arise with regard to the substrate and dopant introduced during the implantation. It is also possible to realize more than three different mask regions in the mask. It is also possible to carry out implantations with the same dopant and different implantation directions within the mask regions through said orientation, different levels of doping with the same dopant being obtained in the different mask regions. It is also possible to combine this with said different dopings with regard to the dopant. It is also possible to effect implantation at different implantation angles from different spatial directions with the same mask.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A mask for producing different dopings in a substrate, the mask being formed from a mask layer having a uniform height h that is arranged on the substrate, the mask comprising:

a first mask region comprising first mask openings, which are formed in elongated fashion and are oriented parallel to a first orientation;

a second mask region comprising second mask openings, which are formed in elongated fashion and are oriented parallel to a second orientation; and a third mask region comprising third mask openings, which are formed in elongated fashion and parallel to a third orientation, wherein the first and second orientations form an angle β where $0° < \beta \leq 90°$, the first and third orientations form an angle different than 0°, and the second and third orientations form an angle different than 0°.

2. The mask as claimed in claim 1, wherein the orientations of the first, second and third mask openings form an angle of 60° with respect to one another.

3. A mask for producing different dopings in a substrate, the mask being formed from a mask layer having a uniform height h that is arranged on the substrate, the mask comprising:
a first mask region comprising first mask openings, which are formed in elongated fashion and are oriented parallel to a first orientation;
a second mask region comprising second mask openings, which are formed in elongated fashion and are oriented parallel to a second orientation; and
a third mask region comprising third mask openings oriented parallel to a third orientation;
wherein the first and second orientations form an angle $\beta$ where $0°<\beta\leq 90°$, and the first, second and third mask regions having mask openings that form an angle of 60° or 120° relative to one another.

4. A mask for producing different dopings in a substrate, the mask being formed from a mask layer having a uniform height h that is arranged on the substrate, the mask comprising:
a first mask region comprising first mask openings, which are formed in elongated fashion and are oriented parallel to a first orientation; and
a second mask region comprising second mask openings, which are formed in elongated fashion and are oriented parallel to a second orientation, the first and second orientations forming an angle $\beta$ where $0°<\beta\leq 90°$,
wherein each mask region comprises a plurality of identical mask openings arranged at the same distance parallel to one another, and width b of the mask openings and/or distance a between the mask openings of the first mask region are different from the mask openings of the second mask region.

5. The mask as claimed in any one of claims 1, 3, and 4 formed as a hard mask composed of oxide or nitride.

6. The mask as claimed in any one of claims 1, 3, and 4 in which it holds true for at least one mask opening that the width b of the mask openings is less than the height h of the mask layer.

7. The mask as claimed in any one of claims 1, 3, and 4 in which each mask region comprises a plurality of identical mask openings arranged at the same distance parallel to one another.

8. The mask as claimed in claim 7, wherein width b of the mask openings and distance a between the mask openings within a mask region are identical.

9. The mask as claimed in any one of claims 1, 3, and 4 wherein the mask openings have the form of elongated rectangles.

* * * * *